United States Patent
LaPoint et al.

(10) Patent No.: US 6,540,952 B2
(45) Date of Patent: Apr. 1, 2003

(54) LASER ABLATION OF MULTIPLE LAYERS

(75) Inventors: James A. LaPoint, River Falls, WI (US); Elizabeth D. Frazee, Hudson, WI (US)

(73) Assignee: Preco Laser Systems, LLC, Somerset, WI (US)

( * ) Notice: Subject to any disclaimer, the term of this patent is extended or adjusted under 35 U.S.C. 154(b) by 0 days.

(21) Appl. No.: 10/100,364

(22) Filed: Mar. 18, 2002

(65) Prior Publication Data

US 2002/0130113 A1 Sep. 19, 2002

Related U.S. Application Data

(60) Provisional application No. 60/276,312, filed on Mar. 16, 2001.

(51) Int. Cl.$^7$ .............................................. B23K 26/38
(52) U.S. Cl. ................. 264/400; 264/139; 264/482; 219/121.68; 219/121.69; 219/121.85
(58) Field of Search .................. 264/138, 139, 264/400, 482; 219/121.65, 121.66, 121.62, 121.68, 121.69, 121.85; 156/250–271

(56) References Cited

U.S. PATENT DOCUMENTS

| | | | |
|---|---|---|---|
| 3,626,141 A | 12/1971 | Daly | 219/121 |
| 3,626,143 A | 12/1971 | Fry | 219/121 |
| 3,909,582 A | 9/1975 | Bowen | 219/121 |
| 4,179,228 A * | 12/1979 | Ross et al. | 407/57 |
| 4,356,375 A | 10/1982 | Josephy et al. | 219/121 |
| 4,549,063 A | 10/1985 | Ang et al. | 219/121 |
| 4,689,467 A | 8/1987 | Inoue | 219/121 |
| 4,720,470 A * | 1/1988 | Johnson | 437/173 |
| 4,789,770 A | 12/1988 | Kasner et al. | 219/121.7 |
| 4,870,244 A | 9/1989 | Copley et al. | 219/121.7 |
| 4,945,203 A | 7/1990 | Soodak et al. | 219/121.64 |
| 5,001,325 A | 3/1991 | Huizinga | 219/121.69 |
| 5,010,231 A | 4/1991 | Huizinga | 219/121.69 |
| 5,103,073 A | 4/1992 | Danilov et al. | 219/121.68 |
| 5,158,499 A | 10/1992 | Guckenberger | 206/524.2 |
| 5,487,852 A | 1/1996 | Ludden et al. | 264/400 |
| 5,491,319 A * | 2/1996 | Economikos et al. | 219/121.69 |
| 5,841,099 A * | 11/1998 | Owen et al. | 219/121.69 |
| 5,843,363 A | 12/1998 | Mitwalsky et al. | 264/400 |
| 5,883,356 A | 3/1999 | Bauer et al. | 219/121.62 |
| 5,900,649 A * | 5/1999 | Effelsberg | 257/81 |
| 6,156,030 A | 12/2000 | Neev | 606/10 |
| 6,163,010 A | 12/2000 | Kobsa | 219/121.61 |

* cited by examiner

Primary Examiner—Stefan Staicovici
Assistant Examiner—K Wanzer
(74) Attorney, Agent, or Firm—Kinney & Lange, P.A.

(57) ABSTRACT

A method of providing multiple arcuate ablations on a corner portion of a polymeric laminate. The laminate includes more than one layer, with each layer having a an exposed upper surface. The method comprises selectively ablating a first layer in a first arcuate path, and selectively ablating remaining layers, each remaining layer ablated in a separate arcuate path. The arcuate path of any layer neither overlays nor underlies the arcuate path of any other layer.

13 Claims, 3 Drawing Sheets

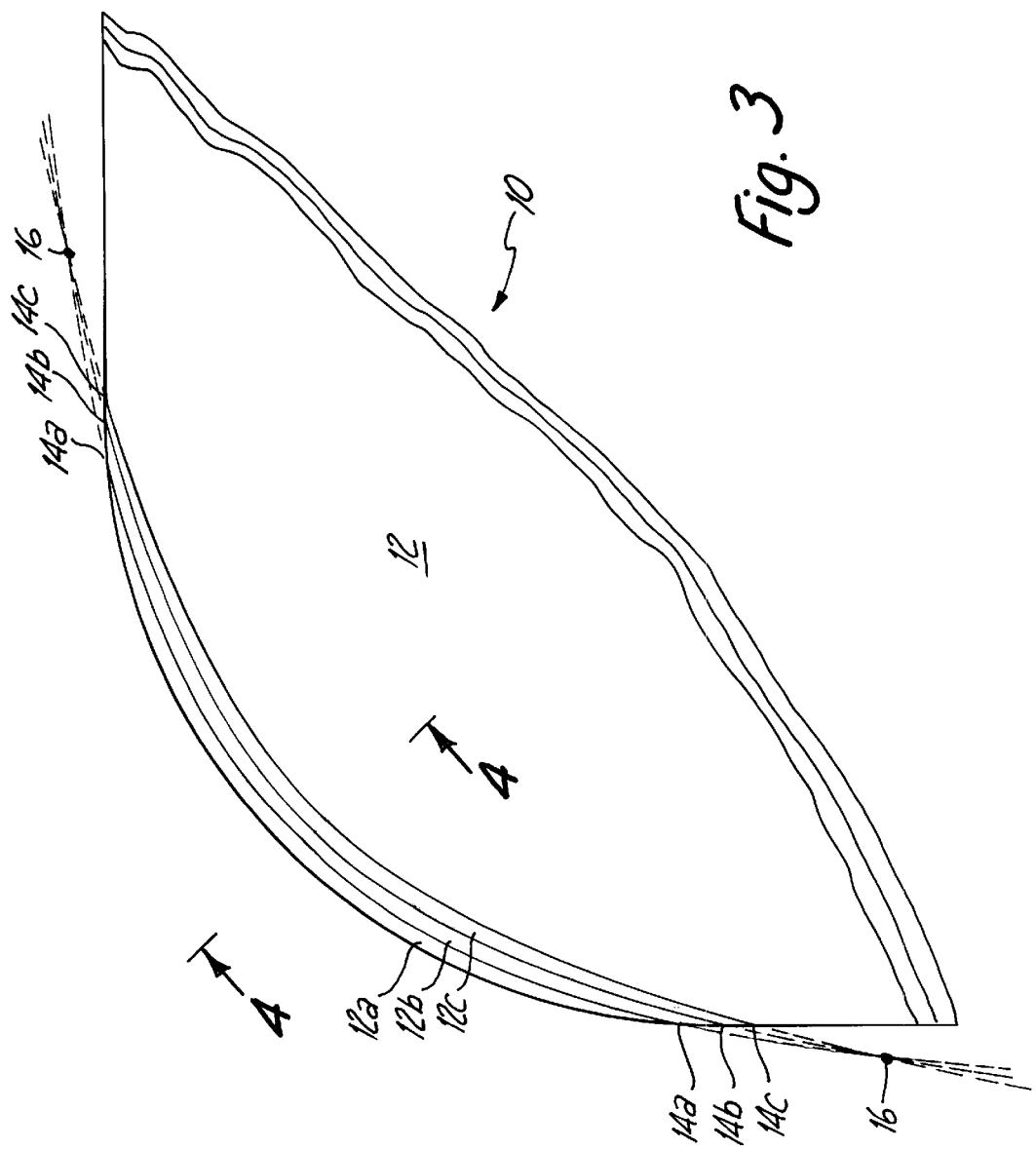

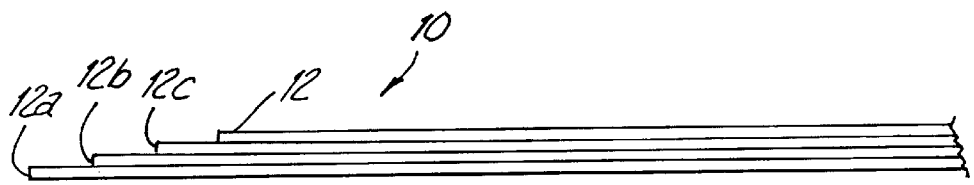
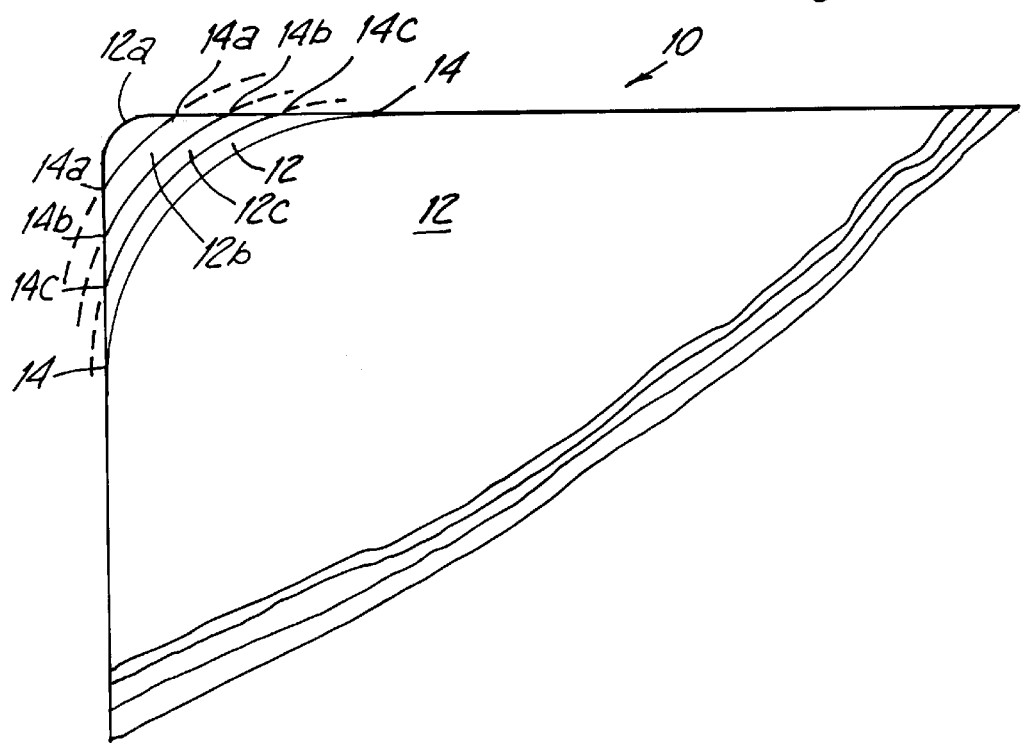

LASER ABLATION OF MULTIPLE LAYERS

CROSS-REFERENCE TO RELATED APPLICATION(S)

Applicant claims the priority date of U.S. Provisional Application No. 60/276,312, filed Mar. 16, 2001.

BACKGROUND OF THE INVENTION

The present invention relates to laser beam ablation. In particular, the present invention relates to a laser ablation technique in which a corner portion of a laminate is ablated in a step-like manner.

For purposes of the present application, ablation is defined as the removal of material from a plastic polymeric substrate with the aid of incident light from a laser beam. Typically in plastics, ablation is either by vaporization or degradation of the substrate. During degradation, laser radiation is used to break the polymeric bonds between the monomers thus forming a gas or a liquid at the focus of the beam. The material is usually either vaporized and ejected by the vapor pressure of the gas or the vapor pressure of the gas is enough to remove any liquid material. A gas jet may be used to assist this process but typically the vaporization of the material provides the majority of the energy to remove the material. The existing technology that provides quality ablation usually requires a laser operating the in ultra- violet using either excimer lasers or Tripled Nd; YAG lasers operating a wavelength of 0.355 microns.

Nd:YAG lasers and excimers have drawbacks when degrading polymeric materials because of the low wattage available (9 watts is a very high power in this class of laser) and the fact these lasers are typically pulsed providing limitations to the speed of removal of material. Industrial processing of polymers requires a much higher power is typically ranging from 25 watts to 200 watts and even up to 2 kilowatts for some applications. Thus the Nd:YAG and excimer lasers are not preferable choices of processing plastics in volume because of the limitations in speed and high cost for even the lower power available.

As mentioned, an alternative technique for laser ablation is vaporization. During vaporization, the substrate material absorbs energy delivered by the laser beam. The absorbed laser energy is converted to thermal energy, and at a certain temperature, dependent upon the characteristics of the substrate material being used, vaporization occurs. These characteristics of the substrate material include absorption depth and heat of vaporization. Because the ability to absorb laser energy is dependent upon the material used, the characteristics of the substrate material also limit the depth at which useful ablation can occur. The depth of the laser ablation is also determined by the laser beam pulse duration, the laser beam energy density, and the laser beam wavelength.

Taking the laser beam wavelength into account, it is preferable that a wavelength be chosen to minimize absorption depth. By minimizing absorption depth, thermal conduction to other areas of a kerf formed by the laser beam are also minimized. This is advantageous in high-precision laser ablation because the kerf is constrained to a more precise area. By constraining the kerf to a precise area, secondary effects of thermal conduction upon the area surrounding the kerf are minimized. These secondary effects include the formation of a plume and a heat affected zone.

Referring to FIG. 1, the plume is a plasma-like substance comprising reacted chemical by-products, molecular fragments, free electrons and ions. The plume is formed when material vaporizes beneath a surface of the material substrate and is not allowed to immediately exit from the kerf; a resultant from having too deep of an absorption depth. The plasma-like plume will optically absorb and scatter the incident laser beam, and can also condense upon the surface of the material substrate immediately surrounding the kerf. This effect leads to deformations on the surface of the substrate, which in most situations is not desirable and not acceptable. By choosing an appropriate wavelength of the substrate material, the absorption depth is minimized which also minimizes the amount of plume present during ablation, if not eradicating the presence of the plume altogether.

Another secondary side effect of thermal conduction upon the surrounding kerf area is that of the heat affected zone. The heat affected zone is defined as the edges of the kerf area immediately following the laser beam where molten material solidifies. The breadth of the heat affected zone is dependent upon the thermal properties of the substrate material. The higher the thermal diffusivity of the substrate material, the greater the extent of the heat affected zone. And as with the plume, absorption depth of the substrate material is also an important factor to take into account. If the absorptive depth of the substrate material is too deep, the vaporized material will not be able to exit the kerf immediately, and the surrounding area will degrade to the extent that thermal conduction through the substrate material allows the energy to pass therethrough. This leads to abnormalities or deformities along the edge of the kerf, including the surface edges of the kerf becoming molten and deforming as molten material within the kerf provide compressive forces along the kerf walls, wherein the kerf walls are defined by the interface between the molten and solidified substrate material. The molten surface edge of the kerf tends to rise above the surrounding surface of the substrate material, then solidify. This produces a deformation or "roll-over," which is disadvantageous for certain applications of the substrate material. An example where it is disadvantageous occurs when the substrate material is a laminate sheet that is placed upon another laminate which was also ablated. The deformation on the surface edge of the kerf prevents full and intimate contact of an adjoining laminate sheet.

Also, when several passes of a laser beam occur relatively near one another, each pass selectively ablating different laminate layers, the heat affected zones of each pass may overlap one another, and either remove unwanted substrate material or deform an edge of a substrate layer proximate the heat affected zone when the molten material, as described above, contacts a layer proximate the ablation point. This deleterious effect becomes more prominent when the layers of the laminate are thin, especially under 2 mils (0.002 inches). Thus, as best illustrated in FIG. 3, upon making several passes within close proximity to one another, the ablation of one pass affects the preceding pass, and an unwanted notch or divot occurs in the polymeric laminate at the ablation edge, or kerf edge.

BRIEF SUMMARY OF THE INVENTION

The present invention includes a polymeric laminate having a generally arcuate, step-like corner portion and method of forming same. The laser ablation technique prevents divots from forming when selectively ablating corner portions of polymeric laminates in a step-like manner. Each layer of the laminate is ablated in a generally arcuate path. The path of a first layer neither overlays nor underlies the arcuate path ablated in any other layer proximate the first layer.

BRIEF DESCRIPTION OF THE DRAWINGS

FIG. 3 is an illustrated top view of a laminated material having been ablated by techniques of the present invention.

FIG. 4 is a cross sectional view taken along lines 4—4 in FIG. 3.

FIG. 5 is an illustrated top view of an alternative laminated material having been ablated by techniques of the present invention.

DETAILED DESCRIPTION

A corner portion of a polymeric laminate of the present invention is generally indicated at 10 in FIG. 3. The polymeric laminate 10 of the present invention includes at least two layers 12 of polymeric substrate material, and may include additional layers 12 depending on the application of the laminate 10. Layers 12 of the polymeric laminate 10 are disposed upon one another, and preferably adhere to one another by static charge. However, any type of suitable adhesive may be used to adhere each layer 12 of the laminates to an adjoining layer. Typically, large sheets of the polymeric laminate are assembled together into a single role, and each sheet is cut to meet the specifications of a specific application.

Preferably, laser ablation is used to cut the polymeric laminate 10 of the present invention. At least one corner portion of the polymeric laminate 10 of the present invention includes each layer 12 disposed in a step-like manner having a generally arcuate shape, as illustrated in FIG. 4. The arcuately shaped, step-like manner of the polymeric laminate 10 conveniently aids in selectively removing a top individual layer 12 from the rest of the polymeric laminate 10 by hand.

Figure 1:
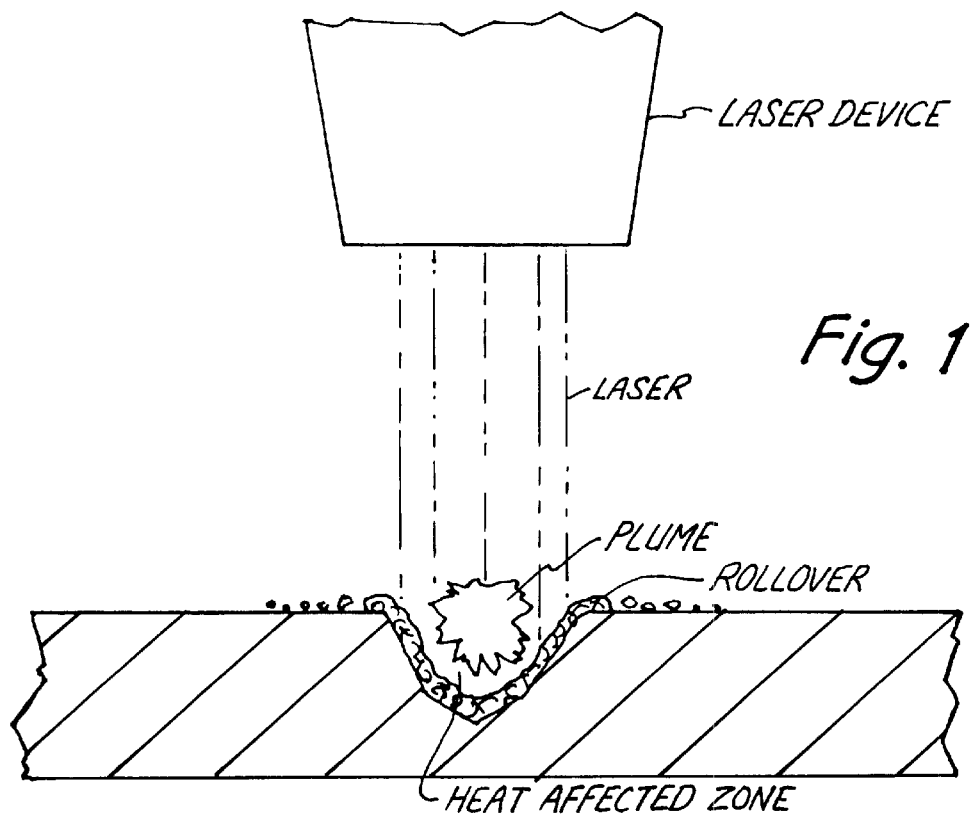
FIG. 1 is an illustrated side view of a laser ablating a substrate material.
Figure 2:
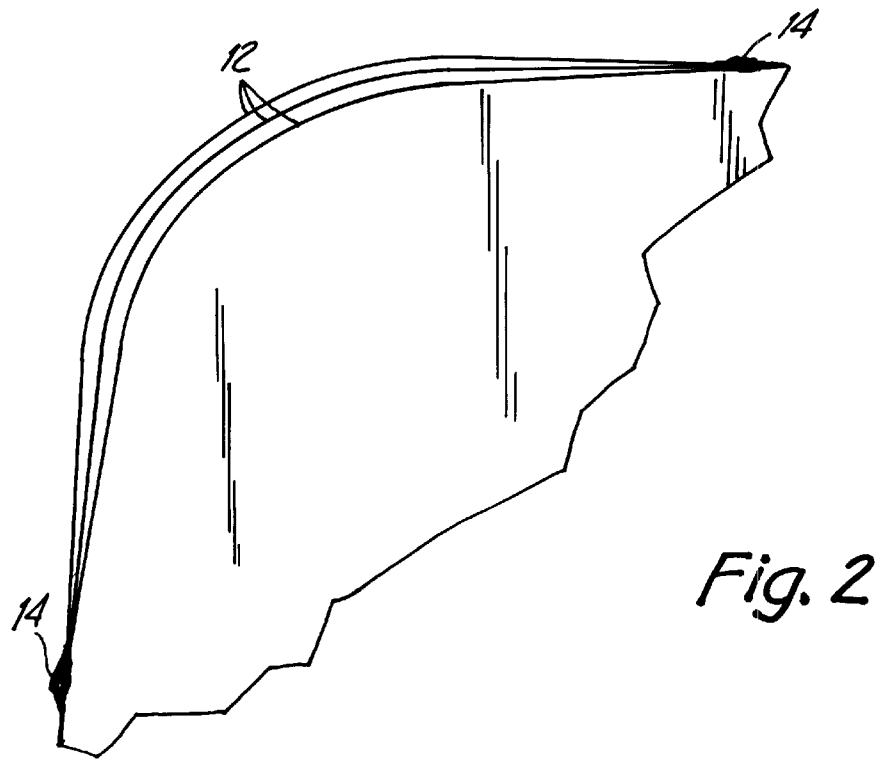
FIG. 2 is an illustrated top view of a laminated material of the prior art having been ablated by several passes of a laser beam.

The polymeric laminates of the prior art were deficient in that each layer of the laminate was ablated to form only a single confluence point 14, as illustrated in FIG. 2. As the laser selectively cut each layer of the laminate 10, with the excess being removed, each pass intersected at the confluence point 14. Regardless the precision of the laser, a divot would appear upon making several passes with the laser to selectively ablate each layer of the laminate. Such deformations are aesthetically unappealing. The method and resulting laminate of the present invention prevents such a deformation.

Using the present inventive method, selective layers 12 of a polymeric laminate 10 were successfully ablated without damaging adjoining layers 12 after several ablation passes. This was accomplished by offsetting and spacing apart the confluence points 14 between the arcuate portions of each layer 12. By offsetting and spacing apart the confluence points 14, the effects of laser ablation were more accurately confined to a single area, and not allowed to accumulate at a single point of confluence 14.

In the preferred embodiment of the present inventive method, a first pass is made by the laser to selectively ablate a first layer 12a of the polymeric laminate 10. The first layer 12a may be a top layer (i.e., the layer most proximate a laser emitting device), or a bottom layer of the polymeric laminate 10. For ease of description of the present invention, the first layer will be the bottom layer, but it should be understood that language such as "top" and "bottom" is only for purposes of describing the present invention, and should by no means be considered as limiting language. The first layer 12a may be ablated to form a generally arcuate surface. By generally arcuate, it is meant that the surface may have any type of curvature, including but not limited to, circular, elliptical, parabolic, hyperbolic oval, and the like. It is also within the scope of the present invention that the radius of curvature for each arcuate portion may be constant, or may be varied to form irregular arcs of curvature. Upon ablating the first bottom layer 12a, each layer 12 disposed upon the first layer 12a is also ablated, with the scrap portions removed from the preferred portion of the polymeric laminate 10.

A similar ablation is then made to a second layer 12b positioned adjacent the first layer. This selective ablation also ablates each layer disposed upon the second layer 12b, but does not ablate the first layer 12a. The path of the second ablation is also generally arcuate, and is spaced apart from the first path. Preferably, confluence points 14a between the first and second layers, 12a and 12b, occur at points on the first layer 12a that were not on the path of the first ablation, which is to say that the points of confluence 14a lie upon generally straight edges of the first layer 12a of the laminate 10.

To selectively ablate a third layer 12c disposed upon the second layer 12b, a similar ablation may be made. The selective ablation of the third layer 12c also ablates each and every layer 12 disposed upon the third layer 12c, but does not ablate the second layer 12b nor the first layer 12a. The path of the third ablation may also be generally arcuate, and is spaced apart from the second path. The points of confluence 14b between the third layer 12c and the second layer 12b are offset and spaced apart from the points of confluence 14a between the first layer 12a and second layer 12b, as illustrated in FIGS. 3 and 5.

Additional layers 12 of the laminate are ablated in much the same way to form the step-like corner portion of the polymeric laminate 10 of the present invention, with each new ablation having points of confluence 14 between the preceding layer spaced apart from points of confluence between the preceding layer and the layer preceding that layer.

Referring to FIG. 3, a preferred embodiment of the present invention is illustrated, wherein each ablated layer may have a parabolic relationship between one another. By parabolic relationship is meant that each arcuate path intersects one another at two points 16 lying beyond the preferred portion of the polymeric laminate 10 (the extended ablation paths and points of intersection 16 shown by dashed lines), share an axis of symmetry and have parallel directrices. By having each arcuate path intersect at points 16 lying in a plane outside the preferred portion of the laminate 10, the points of confluence 14 between each layer offset one another and are spaced apart.

Referring to FIG. 5, an alternative embodiment of the present invention is illustrated, wherein each ablated layer 12 may have a circular relationship between one another. By circular relationship is meant that each arcuate path has the same radius of curvature, but with spaced apart center of radii. By having each arcuate path share the same radius of curvature, but have each center of radius spaced apart, the points of confluence 14 between each layer 12 offset one another and are spaced apart.

Although the present invention has been described with reference to preferred embodiments, workers skilled in the art will recognize that changes may be made in form and detail without departing from the spirit and scope of the invention.

What is claimed is:

1. A method of providing multiple arcuate ablations on a corner portion of a polymeric laminate, the laminate having more than one layer, each layer ablated to have an exposed upper surface, the method comprising:

selectively ablating a first layer in a first arcuate path;

selectively ablating remaining layers, each remaining layer ablated in a separate arcuate path;

wherein the arcuate path of any layer neither overlays nor underlies the arcuate path of any other layer.

2. The method of claim 1 wherein each path extends from a first side of the corner portion to an adjacent second side of the corner portion.

3. The method of claim 1 wherein each path is parabolic, each parabolic path having parallel directrices and sharing two common points, each common point located outside a preferred portion of the laminate.

4. The method of claim 1 wherein each arcuate path is circular, each path having a common radius of curvature, wherein the center of radius for each path is spaced apart from a center of radius of the second pattern.

5. A method of providing multiple ablations with a laser on a corner portion of a polymeric laminate, the laminate having at least two layers, each layer ablated to have an exposed upper surface, the method comprising:

ablating a first layer in a first arcuate path;

ablating a second layer in a second arcuate path; and wherein each arcuate path neither overlays nor underlies one another.

6. The method of claim 5 and further comprising ablating additional remaining layers in separate paths, wherein each path neither overlays nor underlies any other path.

7. The method of claim 5 wherein each path extends from a first side of the respective layer to an adjacent second side of the respective layer.

8. The method of claim 5 wherein each layer has a thickness of less than 0.002 inches.

9. The method of claim 5 wherein each arcuate path is circular, each path having a common radius of curvature, wherein the center of radius for each path is spaced apart from a center of radius of the second pattern.

10. The method of claim 5 wherein each path is parabolic, each parabolic path having parallel directrices and sharing two common points, each common point located outside a preferred portion of the laminate.

11. A method of providing multiple ablations with a laser on a corner portion of a polymeric laminate, the laminate having at least three layers, each layer ablated to have an exposed upper surface, the method comprising the steps of:

ablating a second layer in a first arcuate path;

ablating a third layer in a second arcuate path, where in each path extends from a first side of the corner portion to an adjacent side of the corner portion;

wherein opposite endpoints of the first arcuate path define a first confluence between the first and second layers;

wherein opposite endpoints of the second arcuate path define a second confluence between the second and third layers, and wherein the first confluence and the second confluence neither overlay nor underlie one another.

12. The method of claim 11 wherein each arcuate path is circular, each path having a common radius of curvature, wherein the center of radius for each path is spaced apart from a center of radius of the second pattern.

13. The method of claim 11 wherein each path is parabolic, each parabolic path having parallel directrices and sharing two common points, each common point located outside a preferred portion of the laminate.

* * * * *